United States Patent [19]
Cliff et al.

[11] Patent Number: 5,982,195
[45] Date of Patent: Nov. 9, 1999

[54] PROGRAMMABLE LOGIC DEVICE ARCHITECTURES

[75] Inventors: Richard G. Cliff, Milpitas; Francis B. Heile, Santa Clara; Joseph Huang, San Jose; Fung Fung Lee, Milpitas; Cameron McClintock, Mountian View; David W. Mendel, Sunnyvale; Bruce B. Pedersen, San Jose; Srinivas T. Reddy, Fremont; Chiakang Sung, Milpitas; Kerry Veenstra, San Jose; Bonnie I. Wang, Cupertino, all of Calif.

[73] Assignee: Altera Corporation, San Jose, Calif.

[21] Appl. No.: 08/873,169

[22] Filed: Jun. 11, 1997

Related U.S. Application Data

[60] Provisional application No. 60/038,287, Feb. 20, 1997.

[51] Int. Cl.$^6$ .................................................. H03K 19/177
[52] U.S. Cl. ................................. 326/41; 326/38; 326/39
[58] Field of Search .......................................... 326/37–41

[56] References Cited

U.S. PATENT DOCUMENTS

| | | |
|---|---|---|
| Re. 34,363 | 8/1993 | Freeman . |
| 3,473,160 | 10/1969 | Wahlstrom . |
| 4,609,986 | 9/1986 | Hartmann et al. . |
| 4,617,479 | 10/1986 | Hartmann et al. . |
| 4,642,487 | 2/1987 | Carter . |
| 4,677,318 | 6/1987 | Vennstra . |
| 4,713,792 | 12/1987 | Hartmann et al. . |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 5,023,606 | 6/1991 | Kaplinsky . |
| 5,073,729 | 12/1991 | Greene et al. . |
| 5,121,006 | 6/1992 | Pedersen . |
| 5,122,685 | 6/1992 | Chan et al. . |
| 5,132,571 | 7/1992 | McCollum et al. . |
| 5,144,166 | 9/1992 | Camarota et al. . |
| 5,208,491 | 5/1993 | Ebeling et al. . |
| 5,218,240 | 6/1993 | Camarota et al. . |
| 5,220,214 | 6/1993 | Pedersen . |
| 5,225,719 | 7/1993 | Agrawal et al. . |
| 5,255,203 | 10/1993 | Agrawal et al. . |
| 5,258,668 | 11/1993 | Cliff et al. . |
| 5,260,610 | 11/1993 | Pedersen . |
| 5,260,611 | 11/1993 | Cliff et al. . |
| 5,274,581 | 12/1993 | Cliff et al. . |

(List continued on next page.)

FOREIGN PATENT DOCUMENTS

| | | |
|---|---|---|
| 454352 A1 | 10/1991 | European Pat. Off. . |
| 463746 A2 | 1/1992 | European Pat. Off. . |
| 630115 A2 | 12/1994 | European Pat. Off. . |
| WO 95/04404 | 2/1995 | WIPO . |
| WO 95/22205 | 8/1995 | WIPO . |

OTHER PUBLICATIONS

R. C. Minnick, "A Survey of Microcellular Research," Journal of the Association for Computing Machinery, vol. 14, No. 2, pp. 203–241, Apr. 1967.

(List continued on next page.)

*Primary Examiner*—Michael Tokar
*Assistant Examiner*—Don Phu Le
*Attorney, Agent, or Firm*—Fish & Neave; Robert R. Jackson

[57] ABSTRACT

A programmable logic device has regions of programmable logic disposed on the device in a two-dimensional array of intersecting rows and columns of such regions. Horizontal interconnection conductors are associated with each row, and vertical interconnection conductors are associated with each column. Local conductors are interspersed between adjacent pairs of regions in each row for supplying signals to the regions on both sides of the local conductors. Subregions of programmable logic in each region generally have a local output and a global output. The global output is only usable to output to the relatively long-distance horizontal and vertical conductors. The local output is additionally usable as a local feedback and as a local connection to an adjacent region.

21 Claims, 5 Drawing Sheets

U.S. PATENT DOCUMENTS

| | | | |
|---|---|---|---|
| 5,323,069 | 6/1994 | Smith et al. | 326/41 |
| 5,338,984 | 8/1994 | Sutherland . | |
| 5,350,954 | 9/1994 | Patel . | |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,467,029 | 11/1995 | Taffe et al. | 326/41 |
| 5,469,003 | 11/1995 | Kean | 326/39 |
| 5,483,178 | 1/1996 | Costello e t al. | 326/41 |
| 5,509,128 | 4/1996 | Chan | 395/311 |
| 5,541,530 | 7/1996 | Cliff et al. | 326/41 |
| 5,598,109 | 1/1997 | Leong et al. | 326/41 |
| 5,815,726 | 9/1998 | Cliff | 326/38 |

OTHER PUBLICATIONS

S. E. Wahlstrom, "Programmable Logic Arrays—Cheaper by the Millions," Electronics, Dec. 11, 1967, pp. 90–95.

*Recent Developments in Switching Theory,* A. Mukhopadhyay, ed., Academic Press, New York, 1971, chapters VI and IX, pp. 229–254 and 369–422.

*The Programmable Gate Array Data Book,* 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electricallyt Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xilinx, Inc., San Jose, CA, pp. 2–7, 2–12, and 2–13.

"XC5000 Logic Array Family, Technical Data, Advance Information," Xilinx, Inc., Feb. 1995.

PROGRAMMABLE LOGIC DEVICE ARCHITECTURES

CROSS-REFERENCE TO RELATED APPLICATION

This application claims the benefit of United States provisional patent application No. 60/038,287, filed Feb. 20, 1997.

BACKGROUND OF THE INVENTION

This invention relates to programmable logic integrated circuit devices, and more particularly to the organization and interconnection of the regions of programmable logic on such devices.

Cliff et al. U.S. patent application Ser. No. 08/672,676, filed Jun. 28, 1996 (which is hereby incorporated by reference herein in its entirety) shows programmable logic devices having regions of programmable logic disposed on the device in a two-dimensional array of intersecting rows and columns of such regions. Each region includes a plurality of subregions of programmable logic. Each subregion is programmable to perform a relatively elementary logic function (e.g., form any logical combination of four input signals applied to the subregion and produce output signals which are the combinatorial signal, the combinatorial signal registered by the subregion, or both the combinatorial and registered signals). Interconnection conductors are provided for programmably interconnecting the inputs and outputs of the subregions. For example, these interconnection conductors may include horizontal conductors extending along each row of regions, vertical conductors extending along each column of regions, and local conductors associated with the regions for bringing signals into the associated regions, conveying signals out of the associated regions, and making local interconnections among the subregions in the associated regions.

For the most part, programmable logic devices are designed as general-purpose devices. This means that the designer of the device does not know all the uses to which the device may be put. For example, the designer does not know precisely how many of various types of interconnection resources to provide in order to ensure that most potential users of the device can make all needed interconnections, without providing such an excess of such resources that large amounts of those resources are unused and therefore wasted in many uses of the device. Excessive amounts of interconnection resources take up space on the device that could be used for additional logic or that could be eliminated in order to reduce the size and cost of the device.

Optimizing the amounts and configurations of the local interconnection resources can be especially important because these resources are replicated so many times on the device and because they are typically provided with high densities of programmable interconnections. For example, full populations of programmable interconnections may be provided between the local conductors associated with each region of programmable logic and the inputs to the subregions of that region. This makes any unnecessary excess in the number of local conductors or other local interconnection capacity extremely costly and undesirable for the device design as a whole.

In view of the foregoing, it is an object of this invention to provide improved organizations for the interconnection resources of programmable logic devices.

It is a more particular object of this invention to improve the organization of the interconnection resources at the local level in programmable logic devices of the general type shown in the above-mentioned Cliff et al. reference.

SUMMARY OF THE INVENTION

These and other objects of the invention are accomplished in accordance with the principles of the invention by providing programmable logic devices of the general type described above in which each group of local conductors is interleaved between two adjacent regions of programmable logic. Each subregion in each region can get some of its inputs from the local conductors on each side of the region that includes that subregion. Each subregion has a so-called global output terminal which is connectable (in the first instance) only to adjacent horizontal (row) and vertical (column) conductors. Each subregion also has a so-called local output terminal which is connectable to an adjacent local conductor. The signal applied to each of the local and global output terminals of each subregion can be either a registered or combinatorial signal of the subregion. The local output terminals of some of the subregions in each region are connectable to the local conductors on one side of that region, while the local output terminals of the other subregions in that region are connectable to the local conductors on the other side of that region.

By making one of the output terminals of each subregion a global output terminal, the number of local conductors associated with the regions can be substantially reduced. Having some of the local output terminals of the subregions in each region feed out to local conductors on each side of the region preserves a large measure of both the intra-region local interconnectivity and the local inter-region interconnectivity.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
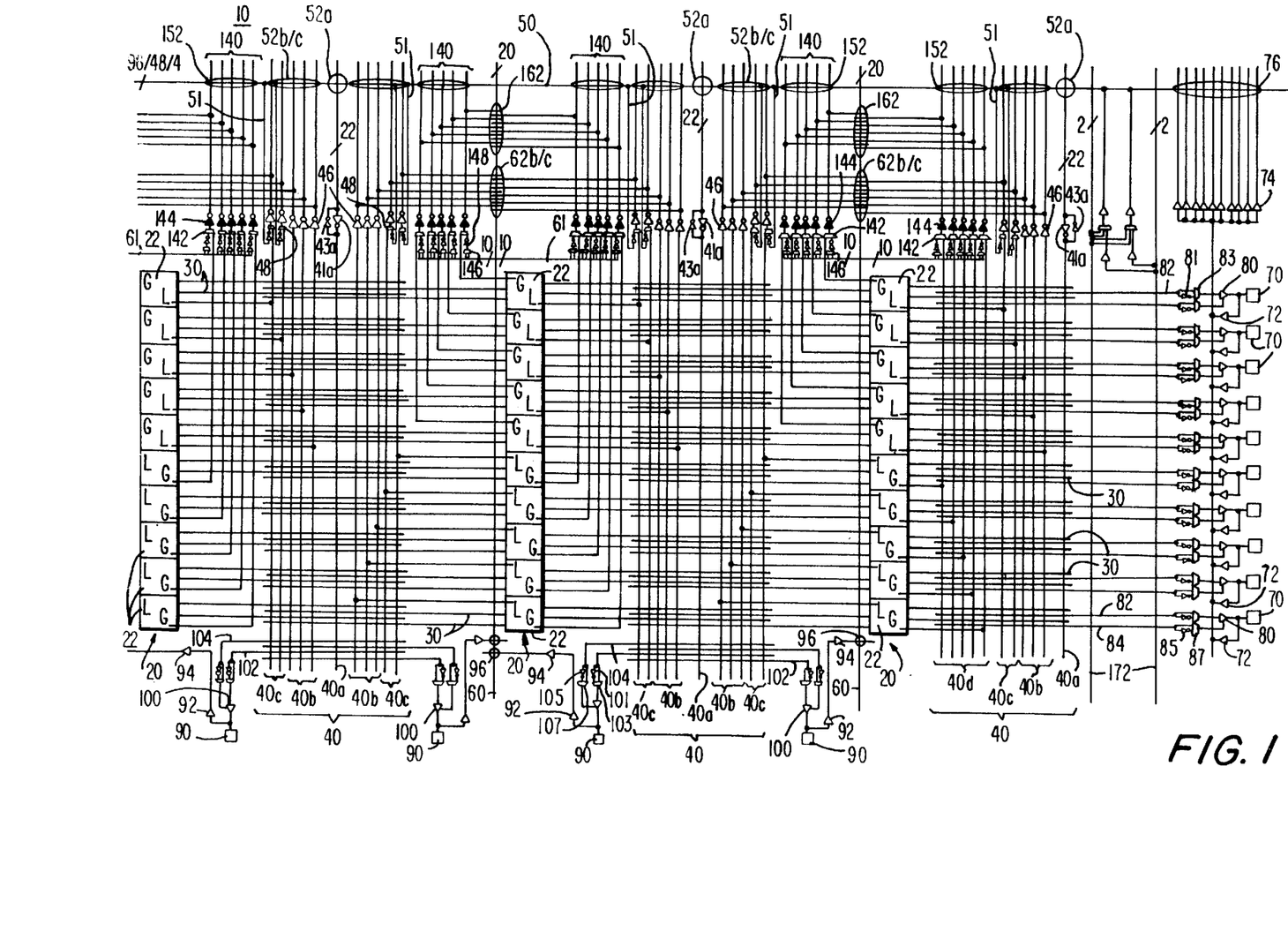
FIG. 1 is a simplified schematic block diagram of a representative portion of an illustrative embodiment of a programmable logic device constructed in accordance with this invention.

FIG. 1 shows the lower right-hand corner of an illustrative programmable logic device 10 constructed in accordance with this invention. FIG. 1 shows three regions 20 of programmable logic from the lower-most of several rows of such regions on device 10. The three depicted regions 20 are also the lower-most regions in the three right-most of several columns of regions 20 on the device.

Each of regions 20 includes several (e.g., ten) subregions 22 of programmable logic. For example, each subregion 22 may include a four-input look-up table which is programmable to produce an output signal which is any logical combination of its four inputs. Each subregion 22 may also include a register (e.g., a flip-flop) for selectively registering the output signal of the look-up table. Each subregion 22 has a local output terminal L and a global output terminal G. Programmable logic connectors ("PLCs") may be included in each subregion 22 for allowing either the combinatorial (look-up table output) signal or the registered (flip-flop output) signal to be applied to each of the local and global output terminals of the subregion. In other words, either the combinatorial or the registered signal of each subregion can be the local output signal of that subregion, and independently of that selection, either the combinatorial or registered signal of the subregion can be the global output signal of the subregion. Additional detail regarding a possible construction of a subregion 22 is shown, for example, in FIG. 3 of the above-mentioned Cliff et al. reference.

Regions 20 are interspersed or interleaved with local interconnection conductors 40. In other words, a group of local conductors 40 is disposed between each horizontally adjacent pair of regions 20. In general, local conductors 40 are of three types, referenced 40a, 40b, and 40c. (A fourth type 40d is included in the right-hand-most group adjacent input/output ("I/O") pins 70, as will be described in more detail below.) Conductors 40a may be referred to as region-feeding conductors, and 22 such conductors are shown in each group of local conductors 40. In general, conductors 40a are used for bringing signals into the adjacent regions (e.g., from the adjacent horizontal conductors 50 that are described below). A driver 41a and a level corrector 43a are included in each conductor 40a for ensuring adequate signal strength on that conductor.

Local conductors 40b and 40c may be referred to as output conductors. Each of conductors 40b and 40c receives the local output signal of an adjacent subregion 22 and can be used to convey that signal out to adjacent horizontal and/or vertical conductors 50 and 60 (described below). Each of conductors 40b and 40c includes a driver 46 for ensuring adequate signal strength on that conductor. The upper parts of conductors 40c can alternatively be used to provide connections from horizontal conductors 50 to other horizontal conductors 50 or to adjacent vertical conductors 60. This is done by programming the associated PLC 48 to disconnect the lower part of the conductor 40c from its upper part, and to instead connect a branch conductor 51 from one of conductors 50 to the upper part of that conductor 40c. If the upper part of a conductor 40c is used as has just been described, the lower part of that conductor can still be used independently for local transmission of a subregion output signal.

Figure 2:
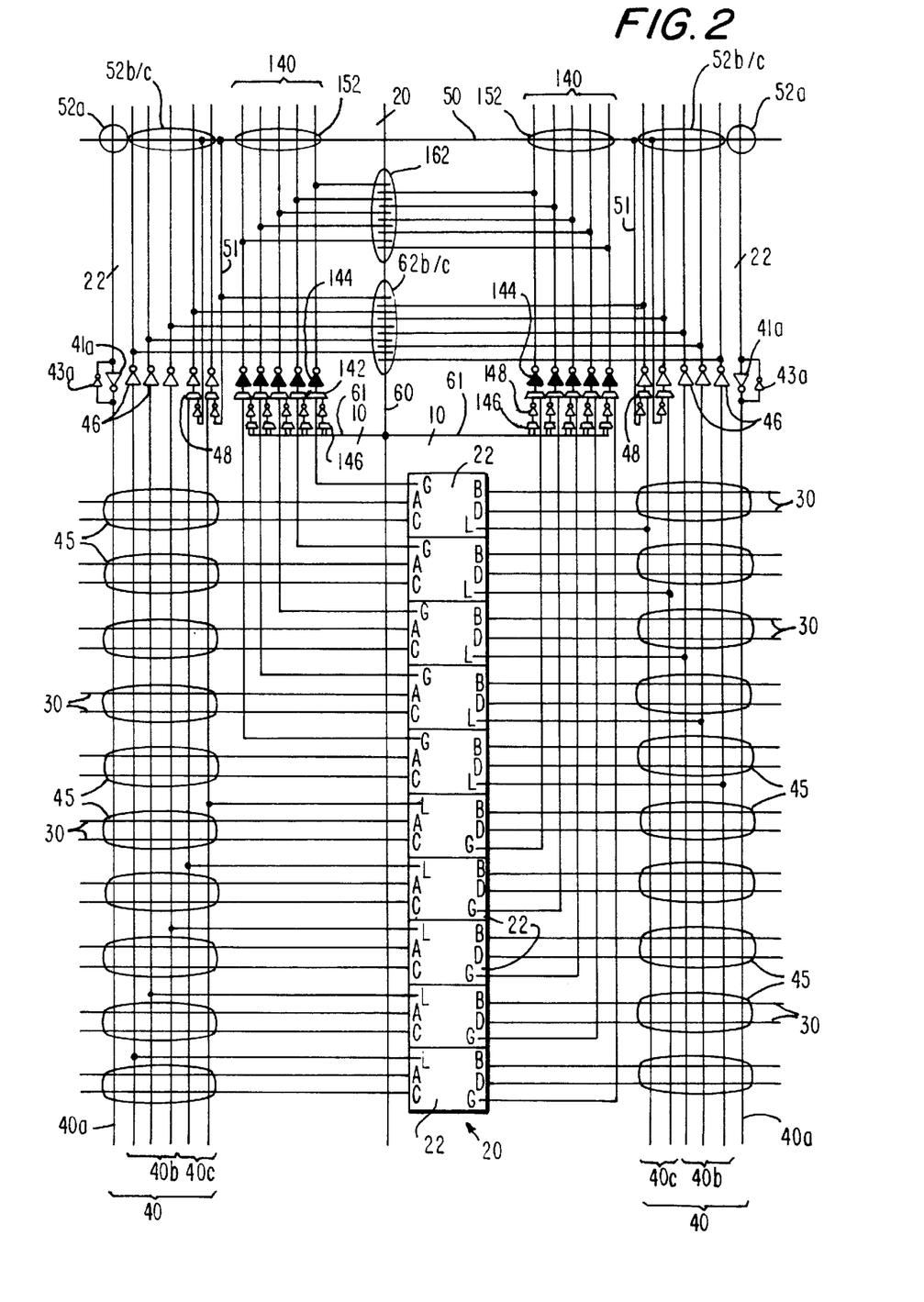
FIG. 2 is a more detailed, but still simplified, schematic block diagram of a representative portion of FIG. 1.

Of the four main inputs 30 to each subregion 22, two come from the left of that subregion, and two come from the right of the subregion. In FIG. 2 the two inputs from the left are designated A and C, and the two inputs from the right are designated B and D. Each input conductor 30 is programmably connectable to any of the local conductors 40 that it crosses by PLCs indicated by the ellipses 45 in FIG. 2. In this way signals on local conductors 40 can be brought into the adjacent subregions 22 via conductors 30. In particular, inputs A and C of a subregion can come from any local conductors 40 to the left of that subregion, and inputs B and D of a subregion can come from any local conductor to the right of that subregion.

Because the local output of each subregion 22 feeds an adjacent local conductor 40b and 40c, that local output can be fed back as an input to any of the subregions in the region that includes that subregion. That local output can also be supplied as an input signal to any of the subregions in the region to the side of the region from which the local output emerges without requiring use of any interconnection conductor resources other than a local conductor 40b or 40c. For example, the local output of the top-most subregion 22 in the center region 20 shown in FIG. 1 can be applied as an input to any subregion in that region or the region to the right. Similarly, the local output of the bottom-most subregion 22 in the center region 20 shown in FIG. 1 can be applied as an input to any subregion in that region or the region to the left.

In general, the global output signal of each subregion 22 is applied to the lower portion of a conductor 140. The lower portion of each such conductor 140 is connectable to the upper portion of that conductor via a PLC 142 and a driver 144 in order to drive the associated global subregion output signal out onto adjacent horizontal and/or vertical conductors 50 and 60. Alternatively, the upper portion of a conductor 140 may be used to connect an adjacent vertical conductor 60 to a horizontal conductor 50 or another vertical conductor 60. This is done using branch conductors 61 from conductors 60. A PLC 146 selects one of two associated branch conductors 61 and applies the selected signal to an associated driver 148. The associated one of abovementioned PLCs 142 selects the output of driver 148 instead of the lower part of the associated conductor 140.

Each row of regions 20 has an associated group of horizontal conductors 50. For example, each group of conductors 50 may include 96 global horizontal conductors which extend all the way across the associated row, 48 half horizontal conductors adjacent to and extending along each left and right half of the associated row, and four so-called fast conductors also extending all the way across the associated row.

Each column of regions 20 has an associated group of vertical conductors 60. For example, each group of conductors 60 may include 20 global vertical conductors which extend all the way along the associated column.

Horizontal conductors 50 have PLCs 52a for selectively connecting selected conductors 50 to conductors 40a. For example, each conductor 40a may be connectable to any of approximately 13 conductors 50 via PLCs 52a. Each conductor 40b or 40c is selectively connectable to selected conductors 50 via PLCs 52b/c. For example, each conductor 40b or 40c may be connectable to any of four conductors 50 via PLCs 52b/c. Each conductor 40b or 40c is also selectively connectable to selected conductors 60 via PLCs 62b/c. For example, each conductor 40b or 40c may be connectable to either of two conductors 60 via PLCs 62b/c. Each of conductors 140 is selectively connectable to selected conductors 50 and 60 via PLCs 152 and 162, respectively. The same is true of somewhat analogous conductors 40d. For example, each conductor 140 or 40d may be connectable to any of six conductors 50 via PLCs 152 and to either of two conductors 60 via PLCs 162.

Adjacent each end of each row of regions 20 there are a plurality of horizontal I/O pins 70. For input purposes, the signal on each pin 70 can be applied to any one or more of several of the adjacent horizontal conductors 50 via drivers 72 and 74 and PLCs 76. For example, each pin 70 may drive any one or more of six global and half horizontal conductors 50 via PLCs 76. (The driving and use of the fast conductors in conductor group 50, as well as conductors 172 and associated elements, is explained later in connection with FIGS. 3 and 4.) For output purposes, each pin 70 may be driven by a tri-state output driver 80. The data input to each driver 80 may be selected to be either the true or complement of the signal on an associated conductor 82. Inverter 81 forms the complement of the conductor 82 signal, and PLC 83 selects either the true or the complement signal for application to the data input terminal of driver 80. The output enable input to each driver 80 may be selected to be either the true or the complement of the signal on an associated conductor 84. Inverter 85 forms the complement of the conductor 84 signal, and PLC 87 selects either the true or the complement signal for application to the output enable input terminal of driver 80. Conductors 82 and 84 are somewhat like subregion input conductors 30 in that they are programmably connectable by PLCs to any of the local conductors 40 that they cross.

Adjacent each end of each column of regions 20 there are a plurality of vertical I/O pins 90. For input purposes, the signal on each pin 90 can be applied via drivers 92 and 94 and PLCs 96 to adjacent vertical conductors 60. For example, the signal from each pin 90 may be applied to either or both of two adjacent vertical conductors 60. For output purposes, each pin 90 may be driven by a tri-state output driver 100. The data input to each driver 100 may be either the true or complement of the signal on an associated conductor 102. An inverter 101 forms the complement of the conductor 102 signal, and PLC 103 selects either the true or complement for application to driver 100. Similarly, the output enable input to each driver 100 may be either the true or complement of the signal on an associated conductor 104. An inverter 105 forms the complement of the conductor 104 signal, and PLC 107 selects either the true or complement for application to driver 100. Conductors 102 and 104 are again like conductors 30 in that they can receive their signals via PLCs from any local conductors 40 that they cross.

The global outputs on the right-hand side of the subregions 22 in the right-most region 20 are routed somewhat differently than other global outputs. Each of these global outputs is connected to an additional local conductor 40*d*. Like other local conductors 40, conductors 40*d* are programmably connectable via PLCs (like 45 in FIG. 2) to any conductor 30, 82, or 84 that they cross. This increases the number of signals available to drive and otherwise control I/O pins 70. In addition, conductors 40*d* are connectable to PLCs 144 like other subregion global outputs.

From the foregoing it will be seen that signals on horizontal conductors 50 can be applied to vertical conductors 60 via elements 51, 48, 46, and 62*b/c*. Signals on vertical conductors 60 can be applied to horizontal conductors 50 via elements 61, 146, 148, 142, 144, 140, and 152. Signals on horizontal conductors 50 can be brought into regions 20 via elements 52*a* and 40*a*, and applied as inputs to subregions 22 via elements 45 and 30. Local outputs of subregions 22 can be applied locally to nearby subregions via elements 40*b/c*, 45, and 30. Local outputs of subregions 22 can also be applied to horizontal and vertical conductors 50 and 60 via elements 40*b/c*, 48, 46, 52*b/c*, and 62*b/c*. Global outputs of subregions 22 can generally be applied to adjacent horizontal and vertical conductors 50 and 60 via components 140, 142, 144, 152, and 162. In the special case near the ends of the rows similar connections are made via elements 40*d*, 142, 144, 152, and 162. Outputs to pins 70 can come from anywhere on the device via horizontal conductors 50 and adjacent components 52*a*, 40*a*, 82, 81, 83, and 80. Alternatively, outputs to pins 70 can come from adjacent subregions 22 via adjacent elements 40*b–d*, 82, 81, 83, and 80. Output enables for pins 70 can come from sources similar to any that can provide output data, albeit via elements 84, 85, and 87. Outputs to pins 90 can come from horizontal conductors 50 via adjacent elements 52*a*, 40*a*, 102, 101, 103, and 100. Alternatively, outputs to pins 90 can come from adjacent subregions 22 via elements 40*b* or 40*c*, 102, 101, 103, and 100. Output enables for pins 90 can come from sources similar to any that can provide output data, albeit via elements 104, 105, and 107. Input routing from pins 70 and 90 has already been fully described.

By generally providing each subregion 22 with only one local output (instead of two as in the above-mentioned Cliff et al. reference), substantial economy is achieved in the local interconnect (i.e., between conductors 40 and 30). Reducing the number of local conductors 40 reduces the number of programmable connections needed to conductors 30. Because there is so much local interconnect on the device, any savings in this area cumulate to significant savings for the device as a whole. At the same time, local interconnect is preserved by the one local output that is provided, and this includes the ability to feed back the local output to any subregion 22 in the region 20 that produced that local output, as well as to subregions in an adjacent region to the left or right, depending on which side of the source region the local output emerges from. Moreover, these connections can be made entirely locally and without use of any long-distance interconnection resources such as 50 and 60. In addition to the local output, each subregion 22 also has a global output so that full output flexibility is still available (e.g., for both registered and combinatorial outputs). If additional local feedback is needed in some situations, a global output can be brought back into a region via a horizontal conductor 50 and a local conductor 40*a*.

Figure 3:
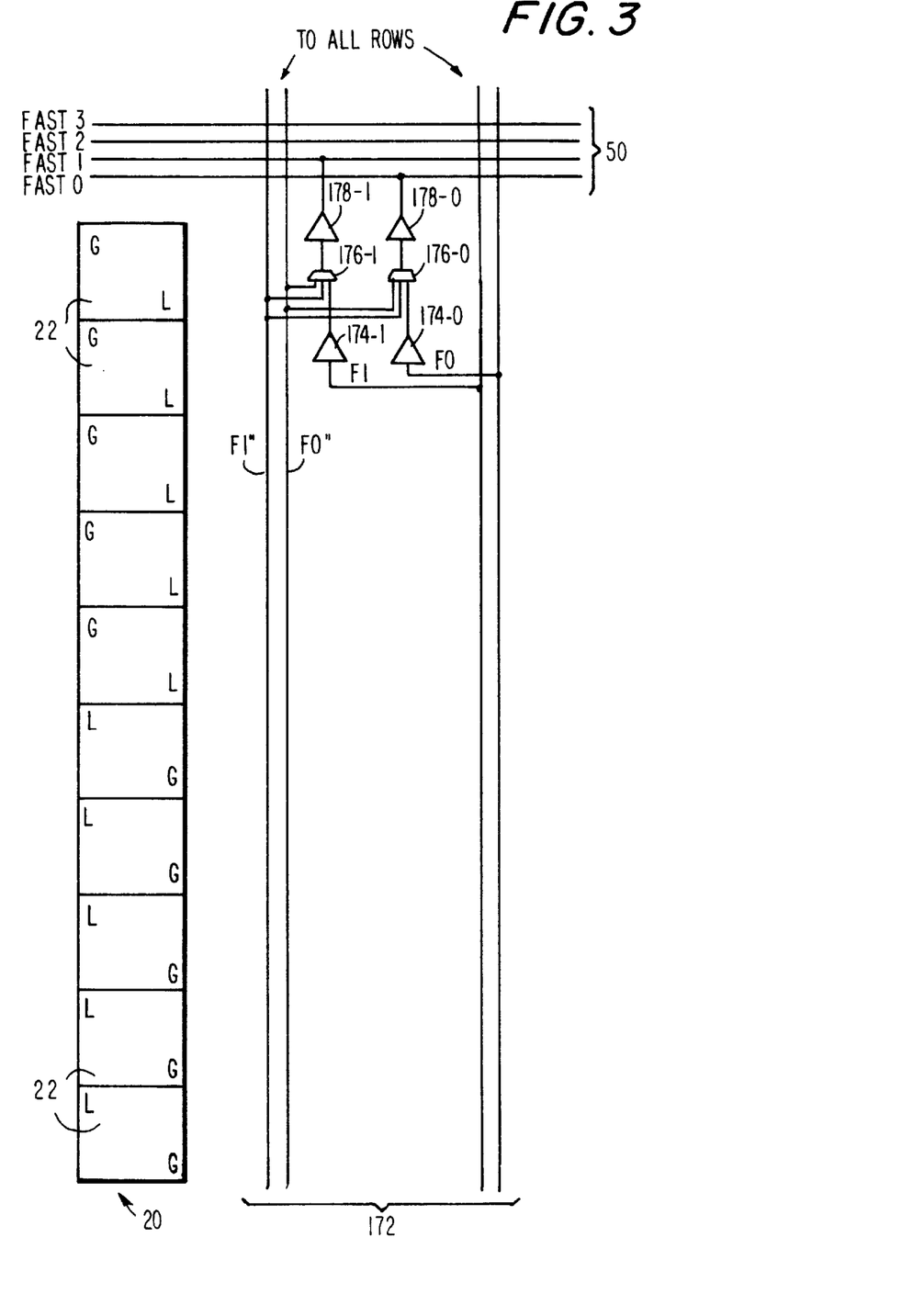
FIG. 3 is a simplified schematic block diagram of a portion of FIG. 1 in more detail.
Figure 4:
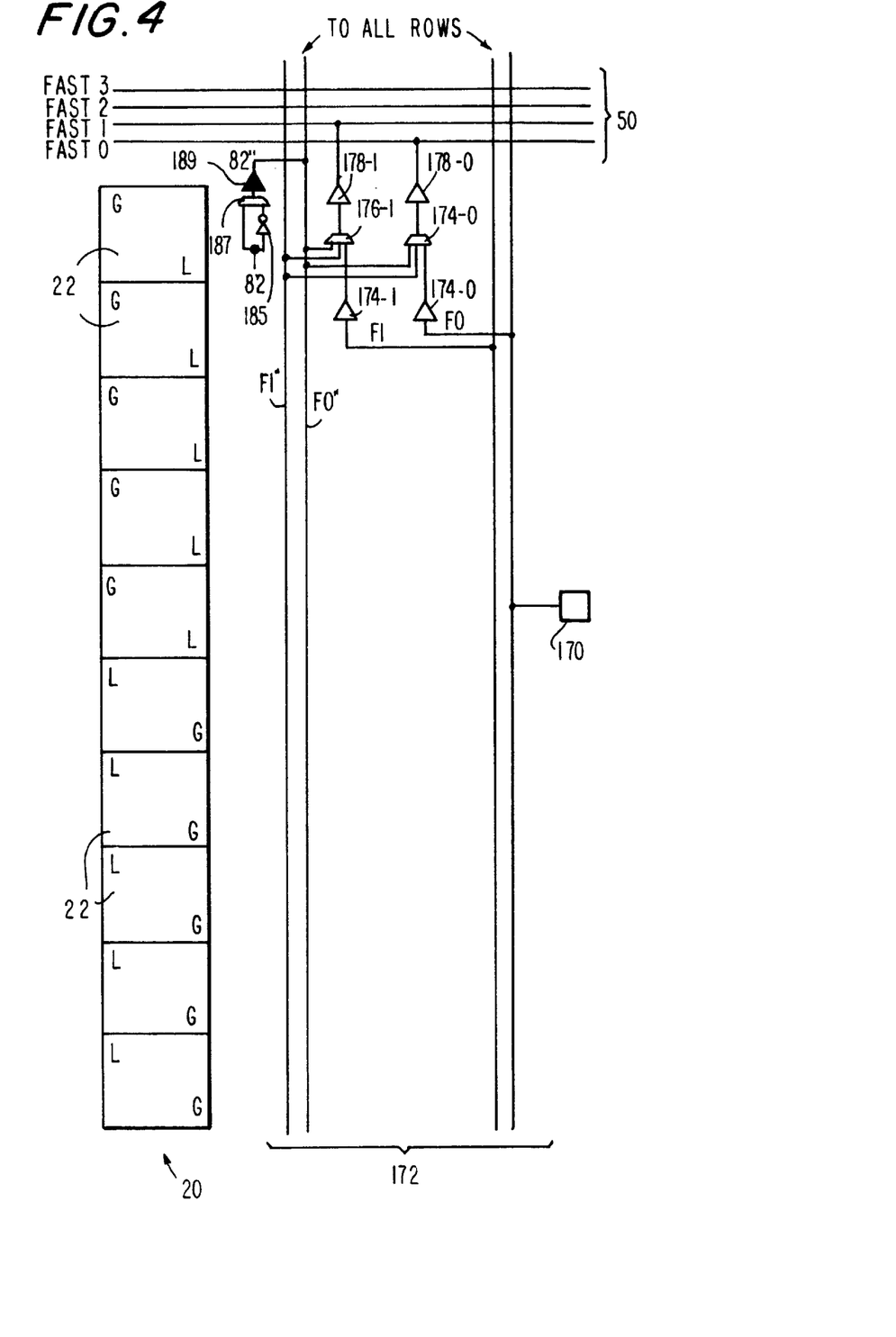
FIG. 4 is a view similar to FIG. 3 showing another representative portion of the device which is shown in part in FIG. 1.

Considering now the four fast conductors in each group of conductors 50, each of these conductors can be driven by fast input pins or by subregions 22 of the center two rows on device 10. These features of the invention are shown in detail in FIGS. 3 and 4. FIG. 3 shows a representative portion of one of the rows on device 10 other than the two center rows. FIG. 4 shows a corresponding representative portion of one of the two center rows. (For example, there may be a total of six rows on device 10.)

FIGS. 3 and 4 show that there are four fast lines (FAST0, FAST1, FAST2, and FAST3) in each group of horizontal conductors 50. There are also four fast input pins 170, one of which is shown in FIG. 4. Two fast input pins 170 are located on the left-hand side of device 10, and two fast input pins 170 are located on the right-hand side of the device. On each side of the device one of these pins is located in each of the two center rows of the device. The four linking conductors 172 (individually labeled F0, F1, F0", and F1" in FIGS. 3 and 4) run continuously along the vertical axis across all of the rows adjacent the right-hand side of the device. Other similar linking conductors 172 (not shown in the drawings but individually identified as F2, F3, F2", and F3") run along the left-hand side of the device in a mirror image of conductors F0, F1, F0", and F1".

From FIGS. 3 and 4 it will be seen that the depicted fast input pin 170 can drive conductor F0 and, via drivers 174-0, PLCs 176-0, and drivers 178-0, the FAST0 conductors in any or all of the rows of the device. Similarly, another fast input pin 170 connected to conductor F1 can drive the FAST1 conductors in any or all of the rows via drivers 174-1, PLCs 176-1, and drivers 178-1. Conductors F3 and F4 on the left-hand side of the device (which are respectively driven by two fast input pins 170 on the left-hand side of the device) can similarly drive the FAST3 and FAST4 conductors in any or all rows of the device.

An alternative source of drive for fast conductors 50 is also present. As shown representatively in FIG. 4, an additional local interconnect output 82 is provided at each end of each of the center two rows of the device. Output 82 is similar to any of outputs 82 in FIG. 1. Thus output 82 can be driven, for example, by the outputs L or G of any of the subregions 22 at the adjacent end of the associated row. (Any other subregion 22 in the associated row can also supply output 82 in FIG. 4 via the horizontal conductors 50 of that row and conductors 40a at the adjacent end of that row.) The output 82 shown in FIG. 4 is inverted by inverter 185 and either the true or the complement signal is selected by PLC 187 for application to driver 189. The output signal of driver 189 is applied to conductor F0". (In the other center row, the corresponding driver 189 output signal is applied to conductor F1", and on the other side of the device the corresponding driver 189 output signals are applied to conductors F2" and F3".) Each of PLCs 176-0 and 176-1 additionally receives and can select the signals on conductors F0" and F1". Thus the signals on conductors F0" and F1" can alternatively be applied to the FAST0 and FAST1 conductors in any or all of the rows on the device. (Similarly, the signals on conductors F2" and F3" can be alternatively applied to the FAST2 and FAST3 conductors in any or all rows of the device.)

From the foregoing it will be seen that the various fast conductors 50 can be variously driven from the fast input pins 170 or the subregions 22 in the center two rows of the device.

Figure 5:
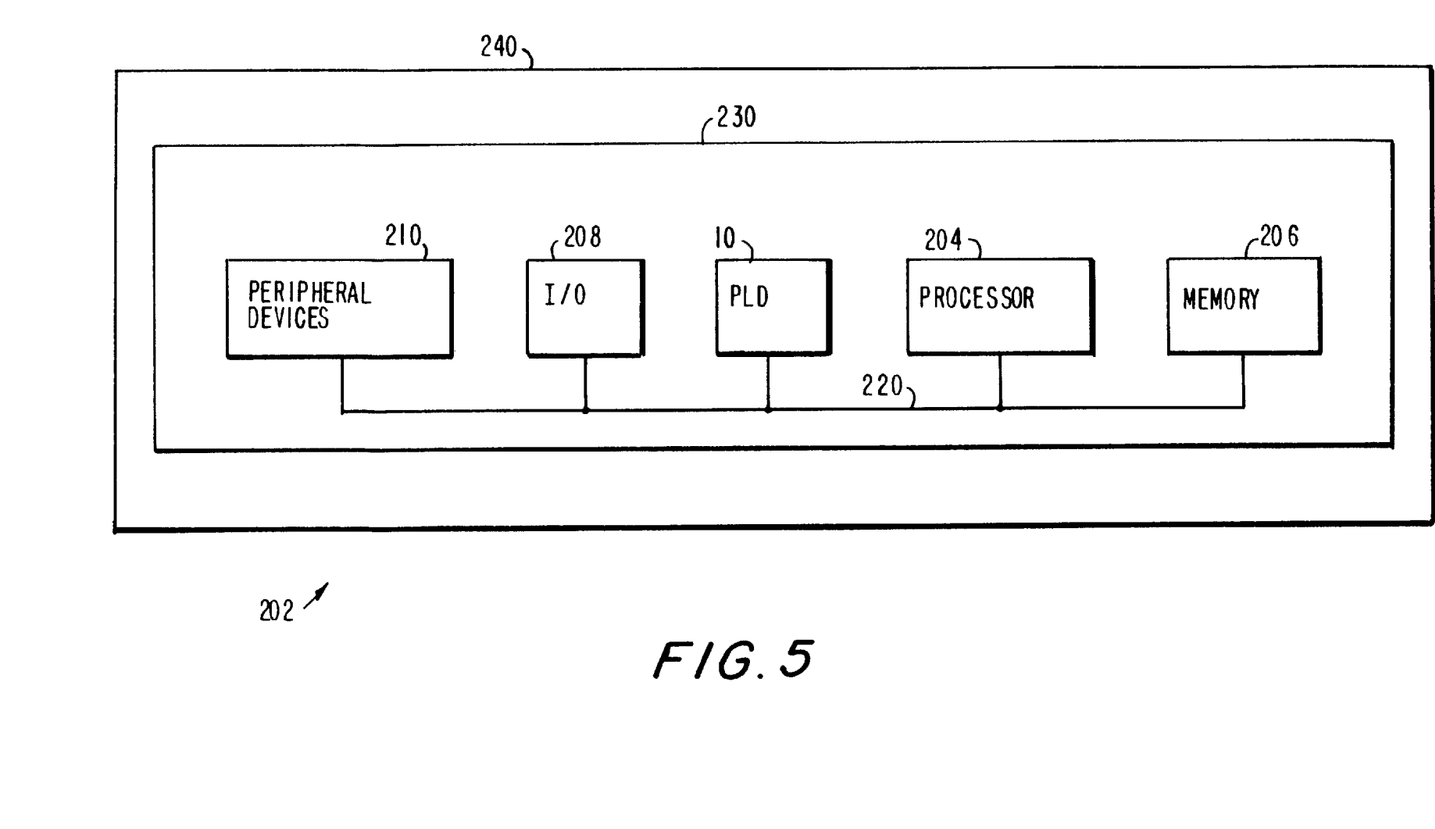
FIG. 5 is a simplified block diagram of an illustrative system employing a programmable logic device in accordance with this invention.

FIG. 5 illustrates a programmable logic device 10 of this invention in a data processing system 202. Data processing system 202 may include one or more of the following components: a processor 204; memory 206; I/O circuitry 208; and peripheral devices 210. These components are coupled together by a system bus 220 and are populated on a circuit board 230 which is contained in an end-user system 240.

System 202 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 204. Programmable logic device 10 may also be used as an arbiter for arbitrating access to a shared resource in system 202. In yet another example, programmable logic device 10 can be configured as an interface between processor 204 and one of the other components in system 202. It should be noted that system 202 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not shown separately in the accompanying drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable both to one-time-only programmable and reprogrammable devices.

It will be understood that the foregoing is only illustrative of the principles of the invention and that various modifications can be made by those skilled in the art without departing from the scope and spirit of the invention. For example, terms like "horizontal" and "vertical", "row" and "column", "left" and "right", "upper" and "lower", and other similar directional or orientational terms are used herein solely for convenience and not with the intention of limiting the referenced structures to any particular directions or orientations. As another example of modifications within the scope of this invention, terms like "region" and "subregion" are used only as relative terms, and the structures referred to herein as subregions may equally be understood to be regions. The numbers of various types of elements such as regions, subregions per region, inputs and outputs per subregion, I/O pins, various types of conductors such as 40, 50, and 60, numbers of PLCs, population densities of PLCs, and the like mentioned herein are only illustrative and can be varied as desired.

The invention claimed is:

1. A programmable logic device comprising:
   a row of regions of programmable logic, each region including a plurality of subregions of programmable logic, each subregion having an output terminal to which the subregion applies a logic output signal;
   a plurality of inter-region interconnection conductors extending along the row;
   a plurality of local interconnection conductors disposed between adjacent pairs of the regions, each local interconnection conductor extending adjacently along all the subregions within a region, wherein the output terminals of some of the subregions in each region are connected to local interconnection conductors on only one side of that region and the output terminals of others of the subregions in that region are connected to local interconnection conductors on only the other side of that region; and
   programmable logic connectors configured to selectively connect the inter-region interconnection conductors and the local interconnection conductors.

2. The device defined in claim 1 wherein each of the subregions includes a plurality of input terminals, some of which are connectable to local interconnection conductors on only one side of the region that includes that subregion, and others of which are connectable to local interconnection conductors on only the other side of that region.

3. The device defined in claim 2 further comprising:
   programmable logic connectors configured to selectively connect the input terminals and the local conductors to which the input terminals are connectable.

4. The device defined in claim 1 wherein each of the subregions further includes a global output terminal to which the subregion applies a further logic output signal, and wherein the device further comprises:
   further programmable logic connectors configured to selectively connect the global output terminals to the inter-region interconnection conductors.

5. The device defined in claim 1 further comprising:

an output pin; and a further programmable logic connector configured to selectively connect some of the local conductors to the output pin.

6. The device defined in claim 1 further comprising:

an input pin; and a further programmable logic connector configured to selectively connect the input pin to some of the inter-region interconnection conductors.

7. The device defined in claim 1 further comprising:

an input/output pin;

a first programmable logic connector configured to selectively connect the input/output pin to some of the inter-region interconnection conductors; and a second programmable logic connector configured to selectively connect some of the local conductors to the input/output pin.

8. The device defined in claim 5 wherein the further programmable logic connector includes a tri-state driver having an output enable terminal, and wherein the device further comprises:

a second programmable logic connector configured to selectively connect some of the local conductors to the output enable terminal.

9. The device defined in claim 1 wherein the plurality of local interconnection conductors disposed between an adjacent pair of regions includes:

a first subplurality of conductors configured to convey signals from the inter-region interconnection conductors to that pair of regions.

10. The device defined in claim 9 wherein the plurality of local interconnection conductors disposed between an adjacent pair of regions further includes:

a second subplurality of conductors configured to convey signals from that pair of regions to the inter-region interconnection conductors.

11. The device defined in claim 10 wherein output terminals of subregions in an adjacent pair of regions are connected only to conductors in the second subplurality between that pair.

12. The device defined in claim 1 wherein the row is one of a plurality of substantially similar rows disposed substantially parallel to one another on the device, each of the rows having an associated plurality of inter-region interconnection conductors, associated pluralities of local interconnection connection conductors, and associated programmable logic connectors, all substantially similar to the corresponding elements associated with the row, and wherein the device further comprises:

a plurality of inter-row interconnection conductors extending between the rows; and second programmable logic connectors configured to selectively connect the inter-region interconnection conductors associated with the rows and the inter-row interconnection conductors.

13. A digital processing system comprising:

processing circuitry;

memory circuitry coupled to the processing circuitry; and a device as defined in claim 1 coupled to the processing circuitry and the memory circuitry.

14. A printed circuit board on which is mounted a device as defined in claim 1.

15. The printed circuit board defined in claim 14 further comprising:

memory circuitry mounted on the printed circuit board and coupled to the device.

16. The printed circuit board defined in claim 14 further comprising:

processing circuitry mounted on the printed circuit board and coupled to the device.

17. A programmable logic device comprising:

a plurality of rows of regions of programmable logic, each of the regions producing output signals which are programmable logic functions of input signals applied to the region;

a plurality of fast signal conductors, each of which extends along a respective one of the rows;

first and second linking conductors, each of which extends adjacent to each of the fast signal conductors;

a fast signal input terminal connected to the first linking conductor;

a first programmable logic connector configured to selectively connect an output signal of a region to the second linking conductor; and a plurality of second programmable logic connectors, each of which is configured to selectively connect either the first or second linking conductor to a respective one of the fast signal conductors.

18. A digital processing system comprising:

processing circuitry;

memory circuitry coupled to the processing circuitry; and a device as defined in claim 17 coupled to the processing circuitry and the memory circuitry.

19. A printed circuit board on which is mounted a device as defined in claim 17.

20. The printed circuit board defined in claim 19 further comprising:

memory circuitry mounted on the printed circuit board and coupled to the device.

21. The printed circuit board defined in claim 19 further comprising:

processing circuitry mounted on the printed circuit board and coupled to the device.

* * * * *